United States Patent [19]

Den Dekker

[11] Patent Number: 5,598,101
[45] Date of Patent: Jan. 28, 1997

[54] CIRCUIT ARRANGEMENT HAVING A WEAR INDICATOR TO INDICATE END OF SERVICE LIFE

[75] Inventor: Wilhelmus P. M. Den Dekker, Eindhoven, Netherlands

[73] Assignee: U.S. Philips Corporation, New York, N.Y.

[21] Appl. No.: 422,014

[22] Filed: Apr. 12, 1995

Related U.S. Application Data

[63] Continuation of Ser. No. 308,469, Sep. 19, 1994, abandoned, which is a continuation of Ser. No. 991,664, Dec. 16, 1992, abandoned.

[30] Foreign Application Priority Data

Dec. 18, 1991 [EP] European Pat. Off. ............. 91203342

[51] Int. Cl.⁶ ..................................................... G01E 31/02
[52] U.S. Cl. ........................... 324/537; 324/548; 324/549; 324/763; 324/765; 340/653
[58] Field of Search ...................................... 324/73.1, 528, 324/529, 530, 537, 548, 549, 555, 755, 763, 765; 340/638, 653, 657; 73/86

[56] References Cited

U.S. PATENT DOCUMENTS

| | | | |
|---|---|---|---|
| 3,272,003 | 9/1966 | Harting | 73/775 |
| 3,289,075 | 11/1966 | Jones | 340/638 |
| 3,657,602 | 4/1972 | Boehm et al. | 324/548 |
| 3,775,686 | 11/1973 | Gänger et al. | 324/546 |
| 3,828,606 | 8/1974 | Wolter | 73/774 |
| 4,142,151 | 2/1979 | Hansen | 324/537 |
| 4,799,019 | 1/1989 | Cooley et al. | 324/537 |
| 4,967,142 | 10/1990 | Sauerwald et al. | 324/73.1 |
| 5,130,689 | 7/1992 | Raykhtsaum et al. | 337/296 |
| 5,243,298 | 9/1993 | Runner | 73/86 X |
| 5,250,905 | 10/1993 | Kuo et al. | 324/435 |
| 5,339,024 | 8/1994 | Kuo et al. | 324/435 |
| 5,396,177 | 3/1995 | Kuo et al. | 324/435 |
| 5,514,974 | 5/1996 | Bouldin | 324/763 |

FOREIGN PATENT DOCUMENTS

| | | |
|---|---|---|
| 2534668 | 8/1975 | Germany . |
| 2195185 | 4/1987 | United Kingdom . |
| 8802182 | 3/1988 | WIPO .............. H01L 21/66 |

*Primary Examiner*—Kenneth A. Wieder
*Assistant Examiner*—Glenn W. Brown
*Attorney, Agent, or Firm*—Steven R. Biren

[57] ABSTRACT

A circuit arrangement includes a wear detector which is proportioned or which operates so that it wears (i.e., fails) faster than the other parts of the circuit arrangement. The wear detector may be made to wear faster than other parts of the circuit by being more heavily loaded during operation, by being configured to be more heavily stressed during operation, or by being subjected to more severe operating conditions. An indicator is connected to the wear detector so that, when the wear detector ceases to function, the indicator signals that the circuit arrangement is near the end of its useful life and is to be replaced.

6 Claims, 1 Drawing Sheet

CIRCUIT ARRANGEMENT HAVING A WEAR INDICATOR TO INDICATE END OF SERVICE LIFE

This is a continuation of application Ser. No. 08/308,469, filed Sep. 19, 1994, now abandoned which is a continuation of application Ser. No. 07/991,664, filed Dec. 16, 1992, now abandoned.

BACKGROUND OF THE INVENTION

The invention relates to a circuit arrangement, comprising a circuit and means for indicating a circuit condition governing its service life.

It is known, inter alia from German Offenlegungsschrift 25.34.668, to provide passive or active components with an external layer whose color is temperature-dependent or which exhibits a permanent discoloring at a given temperature.

Any short-circuiting or overloading can be detected on the basis thereof. However, the components need be regularly inspected visually in order to check whether short-circuiting or overloading has occurred.

Furthermore, from British Patent Specification No. 2,195,185 it is known to provide an integrated circuit with test means whereby the condition of the integrated circuit can be tested, the test result (the condition of the integrated circuit) being provided via an output pin. Said test means indicate whether a tested integrated circuit operates correctly or not. However, expensive, complex electronic systems may break down at inconvenient times. If no (expensive) back-up system is provided, incredible disruptions can occur in the services provided by the relevant systems, for example in electronic payment systems or in computer-controlled vessels, airplanes, air traffic control systems or in chemical installations. The foregoing is undesirable, especially if repair times are unacceptably long.

SUMMARY OF THE INVENTION

It is inter alia an object of the invention to provide a circuit arrangement which is capable of detecting the forthcoming expiration of its service life.

To achieve this, the invention provides a circuit arrangement, comprising a circuit and means for indicating a circuit condition governing its service life, characterized in that the means comprises a wear indicator, a functional parameter of which is proportioned so that during operation of the circuit the wear indicator will become defective before the circuit itself becomes defective, and in that the means further comprises a detector for signalling a defective condition of the wear indicator. The circuit and the wear indicator may be integrated on a semiconductor substrate.

An embodiment of the circuit arrangement in accordance with the invention is characterized in that the circuit comprises a first component and the wear indicator comprises a second component, the first and the second components being functionally similar, the second component being loadable to a higher degree than the first component during operation of the circuit arrangement.

A further embodiment of the circuit arrangement in accordance with the invention is characterized in that the first and the second components each comprise at least one of the following components: a transistor, a diode, a resistor, a fuse, or a capacitive load.

Faster degeneration can be achieved by choosing one of the parameters of one or several transistors, diodes or passive electronic components in a circuit arrangement so that these transistors or diodes, or further transistors, diodes or even passive elements (fuses) connected in series therewith, are loaded to a higher degree. An example of such an embodiment of a circuit arrangement in accordance with the invention is characterized in that the first and the second component deviate from one another in respect of the proportioning of at least one of the following functional parameters: threshold voltage of the transistor, channel length of the transistor, substrate surface area of the transistor, thickness of a gate oxide of the transistor, breakdown value of the fuse, bias voltage of the transistor, supply voltage across the components, value of the capacitive load.

The detector is preferably constructed so as to form a functional part of a boundary scan test system.

BRIEF DESCRIPTION OF THE DRAWING

The invention will be described in detail hereinafter with reference to the accompanying diagrammatic drawing, in which.

DESCRIPTION OF THE PREFERRED EMBODIMENTS

Figure 1:
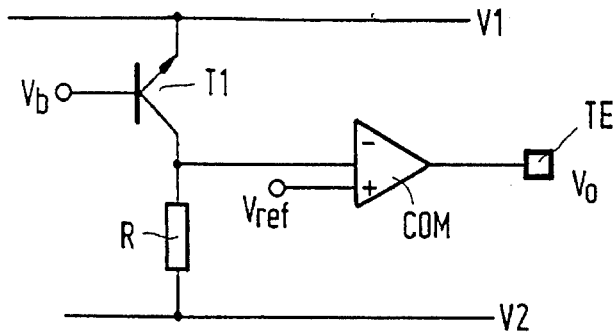
FIG. 1 shows an embodiment of a wear detector.

FIG. 1 shows an embodiment of a first end-of-life detector which comprises a transistor T1 in series with a resistor R. The series connection of T1 and R is arranged, for example, between the supply voltages V1 and V2 of the integrated circuit, only a comparator COM thereof being shown. A first input (−) of the comparator COM is connected to a node between the transistor T1 and the resistor R. A second input (+) of the comparator receives a reference voltage Vref, and the base of the transistor T1 receives a bias voltage Vb. When the integrated circuit comprises logic circuits controlled by clock pulses, the base of the transistor T1 may also be controlled by way of said clock pulses.

The parameters of the transistor T1 and/or of the resistor R should deviate from the parameters of similar components, as is explained below. The transistor TI may be proportioned so as to be larger (e.g., larger emitter surface), so that the resistor R must dissipate a higher power than similar resistors in the integrated circuit. The resistor R will thus break down sooner than the other resistors, so that it acts as a fuse. In a clock pulse controlled system, the (−) input of the comparator will then no longer receive pulses; this is signalled via the output of the comparator COM, which is connected to an output terminal TE of the integrated circuit, and can be signalled to the user of the IC either optically, acoustically or in another perceivable manner.

The resistor R may also have a "normal" construction, like the other resistors in the integrated circuit, and in that case it has a resistance and a dissipation such that the resistor R operates "normally", whereas the transistor T1 is set to a working point, using the bias voltage Vb, where a maximum dissipation fusible for said resistor R occurs in the transistor T1. The proportioning of the transistor T1 and its continuous setting, causing a maximum dissipation, ensure that the transistor T1 breaks down sooner than the other transistors in the integrated circuit. The (−) input of the comparator COM then continuously receives the voltage V2. The (+) input thereof can use V2 as Vref. Alternatively, the transistor TI may be constructed as a diode by connecting its base to its collector.

Figure 2:
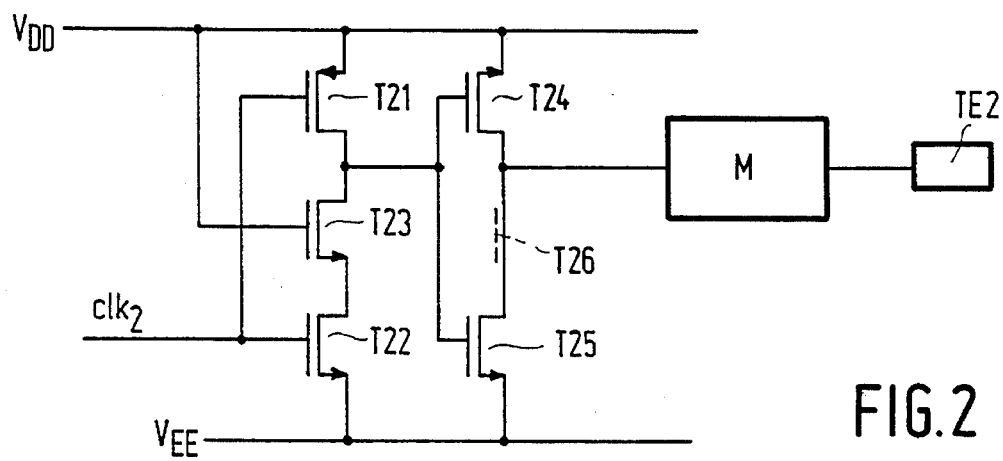
FIG. 2 shows an embodiment of a non-d.c. dissipating wear detector.

FIG. 2 shows a further embodiment of a wear detector in accordance with the invention which comprises a first CMOS inverter which is formed by T21 and 722 and a second CMOS inverter, formed by 724 and T25, which is connected in series therewith. Inverters of this kind often include a safety transistor, such as the transistor T23, in order to protect the (N-)MOS transistors provided therein against hot-electron degradation. This is a common solution for sub-micron integrated circuits. A transistor T26 in the inverter 724, 725 is denoted merely by a dashed line in the figure. In accordance with the invention, the transistor 726 can either be omitted or may have a threshold voltage which is lower than that of the transistor 723. The latter can be achieved, for example, by way of ion implantation. Consequently, in the course of time the transistor T25 will break down first if the transistors 721, T22, 723 and T24 are constructed like the other, same P-MOS or N-MOS transistors in the integrated circuit.

As soon as the transistor 725 breaks down, the clock pulses clk presented to the input of the inverter T21, 722 will no longer be received, via the second inverter T24, T25, on the input of a monostable multivibrator M, so that the logic output level of the multivibrator M changes; this can be measured at an output terminal TE2 of the integrated circuit.

Figure 3:
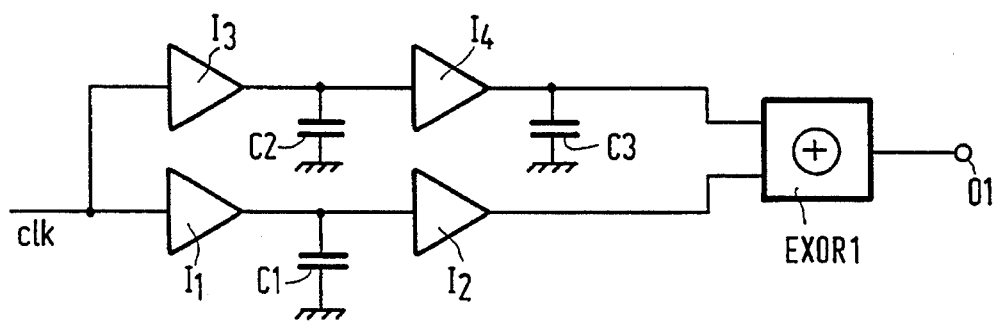
FIG. 3 shows a further embodiment of a non-d.c. dissipating wear detector.

FIG. 3 shows another embodiment of a wear detector in accordance with the invention, comprising four inverters I1, I2, I3 and I4, three capacitances, and a logic gate EXOR1. The inverters I1 and I2 on the one side and the inverters I3 and I4 on the other side are connected in series. The inverter I1 is loaded by a capacitance C1 which is substantially higher than the other capacitive loads in the integrated circuit, whereas the inverter I1 corresponds to "standard" inverters.

Because of the higher capacitive load, the transistors of the inverter I1 will always have to deal with charging and discharging currents during a longer time interval, causing degradation and ultimate failure of (one of) the transistors of the inverter I1. Clock pulses clk will then no longer be applied to the first input of the exclusive-OR gate EXOR1 via the inverter I2.

Via the inverters I3 and I4, the clock pulses received on the input of I3 will be applied to the second input of the gate EXOR1. As long as the inverter I1 operates correctly, the output 0 1 will remain high, because the first and the second input of the gate EXOR1 both receive the clock pulses clk. The capacitances C2 and C3 are provided to ensure the same signal delay as the capacitance C1 in the inverter chain I1 and I2. If necessary, the chain I3, I4 can be extended by way of 2,4 or 6 etc. additional inverters, the capacitances C2 and/or C3 being distributed across said chain so as to ensure reliable operation of the second chain.

As soon as the inverter I1 no longer operates correctly, the delayed clock pulses can be detected on the output 01 of the gate EXOR1.

Figure 4:
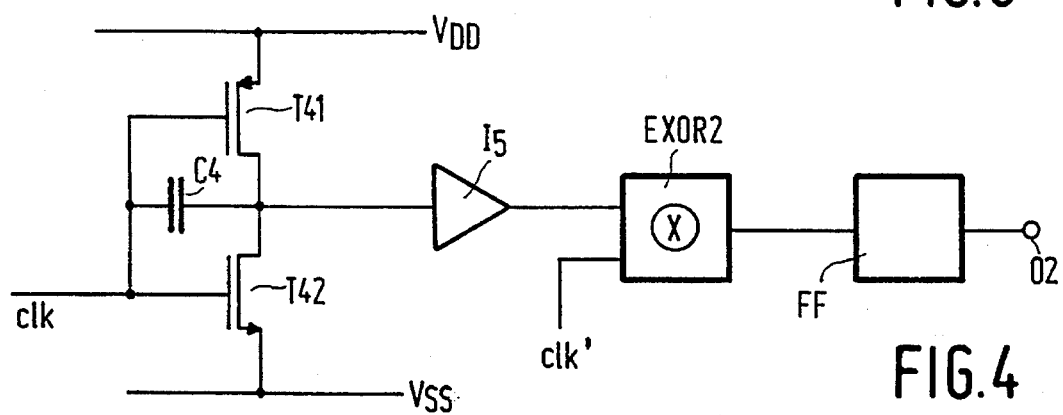
FIG. 4 shows another embodiment of a non-d.c. dissipating wear detector.

In another embodiment of a wear detector as shown in FIG. 4, the wear detector in an integrated circuit in accordance with the invention comprises a CMOS inverter which includes two transistors T41 and T42, a capacitance C4 being connected to the gates thereof. The gates also receive a clock signal clk. Therefore, in response to the successive rising and failing edges of the clock pulses an additional discharge current and charge current, respectively, is produced, via the transistors T42 and T41, respectively, from and to the capacitance C4, respectively. Furthermore, due to the additional capacitance C4, the transistors T41 and T42 will carry more than the normal supply voltage VDD-VSS between the drain and the source as a result of the boost function of the capacitance C4, so that the inverter T41, T42 will break down in the course of time, that is to say sooner than other inverters and other circuits in the integrated circuit which are "normally" proportioned and/or "normally" loaded and which operate "normally". As soon as the inverter T41, T42 breaks down, clock pulses clk will no longer be applied to the exclusive-OR gate EXOR2 via the inverter T41, T42 and the inverter 15, said exclusive-OR gate receiving delayed clock pulses clk' on a second input. The delay of the clock pulses clk' equals the delay incurred by the clock pulses clk due to the inverter T41, T42 and the inverter 15. For as long as the inverter T41, T42 operates correctly, the output of the gate EXOR2 will be high, because the pulses clk' and the pulses on the output of the inverter I5 are coincident in time. As soon as the inverter T41, T42 breaks down, the logic level on the output of the gate EXOR2 changes and the flip-flop FF is set; this can be detected on the output 02.

The flip-flop FF preferably forms part of a boundary scan test system as described, for example in British Patent Specification Nr. 2,195,185. After application of a given code to the integrated circuit, the state of the flip-flop FF can be read so as to initiate a signalling that replacement of the integrated circuit is flue. Evidently, the outputs of the embodiments shown in the FIGS. 1 to 3 can also be read by way of a similar scan test system.

I claim:

1. A circuit arrangement, comprising a circuit having a first component and means for indicating a circuit condition governing circuit end of service life, characterized in that the means comprises a wear indicator circuit comprising a second component, an electrical functional parameter of said second component being proportioned so that during normal operation of the circuit the second component of the wear indicator circuit will become defective before the first component of the circuit becomes defective, the first and second components performing the same electrical function during normal operation of the circuit, the means comprising a detector for signalling a defective condition of the wear indicator to indicate the circuit is near the end of its service life, and the circuit and the wear indication being integrated on a semiconductor substrate.

2. A circuit arrangement as claimed in claim 1, characterized in that the wear indicator comprises a sub-circuit which is controlled by clock pulses.

3. The circuit arrangement of claim 1, characterized in that the second components is loadable to a higher degree than the first component during operation of the circuit arrangement.

4. The circuit arrangement of claim 3, characterized in that the first and the second components each comprise at least one of a transistor, a diode, a resistor, a fuse, and a capacitive load.

5. The circuit arrangement of claim 3, characterized in that the first and the second components deviate from one another in respect of the proportioning of at least one of threshold voltage of a transistor, channel length of a transistor, substrate surface area of a transistor, thickness of a gate oxide of a transistor, breakdown value of a fuse, bias voltage of a transistor, supply voltage across the components, and value of a capacitive load.

6. The circuit arrangement of claim 1, characterized in that the detector is constructed so as to form a functional part of a boundary scan test system.

* * * * *